US 8,589,708 B2

(12) United States Patent
Flynn et al.

(10) Patent No.: US 8,589,708 B2
(45) Date of Patent: Nov. 19, 2013

(54) REDUCING POWER CONSUMPTION IN CLOCK AND DATA RECOVERY SYSTEMS

(75) Inventors: James P. Flynn, Beaverton, OR (US); John T. Stonick, Portland, OR (US); Daniel K. Weinlader, Allentown, PA (US); Jianping Wen, Beaverton, OR (US); Skye Wolfer, Hillsboro, OR (US); David A. Yokoyama-Martin, Portland, OR (US)

(73) Assignee: Synopsys, Inc., Mountain View, CA (US)

( * ) Notice: Subject to any disclaimer, the term of this patent is extended or adjusted under 35 U.S.C. 154(b) by 689 days.

(21) Appl. No.: 12/797,411

(22) Filed: Jun. 9, 2010

(65) Prior Publication Data

US 2011/0307722 A1  Dec. 15, 2011

(51) Int. Cl.
*G06F 1/32* (2006.01)
*G06F 1/06* (2006.01)

(52) U.S. Cl.
USPC ........... 713/322; 713/300; 713/310; 713/320; 713/321; 375/354; 375/376

(58) Field of Classification Search
None
See application file for complete search history.

(56) References Cited

U.S. PATENT DOCUMENTS

| 7,486,718 | B2 * | 2/2009 | Sutardja et al. | 375/215 |
| 7,580,637 | B2 * | 8/2009 | El-Ahmadi et al. | 398/135 |
| 7,587,012 | B2 * | 9/2009 | Evans et al. | 375/354 |
| 2008/0080656 | A1 * | 4/2008 | Wilson et al. | 375/376 |
| 2009/0289667 | A1 * | 11/2009 | Novellini et al. | 327/105 |

* cited by examiner

*Primary Examiner* — Fahmida Rahman
(74) *Attorney, Agent, or Firm* — Park, Vaughan, Fleming & Dowler LLP; Chia-Hsin Suen

(57) ABSTRACT

Some embodiments provide a clock and data recovery (CDR) system to recover clock and data information from an analog signal. The CDR system may include an integral path and a proportional path that are part of an integral-proportional control loop. The integral path may be used to track frequency changes in a clock signal that is embedded in the analog signal, while the proportional path may be used to track phase changes in the clock signal that is embedded in the analog signal. The proportional path may be executed at a first clock frequency, while the integral path may be executed at a second clock frequency that is lower than the first clock frequency to reduce the power consumption of the CDR system.

13 Claims, 3 Drawing Sheets

REDUCING POWER CONSUMPTION IN CLOCK AND DATA RECOVERY SYSTEMS

BACKGROUND

1. Technical Field

The present embodiments relate to clock and data recovery (CDR) systems. More specifically, the present embodiments relate to techniques for reducing power consumption in high-frequency CDR systems.

2. Related Art

High-speed serial interfaces for point-to-point communication over a link may clock the two endpoints of the link using different clock sources. Some serial data communication standards may require the serial interface to vary its clock frequency (e.g., by using a spread spectrum clock) to reduce electromagnetic interference (EMI). The receiver endpoint of a serial interface may thus include a clock and data recovery (CDR) mechanism to recover the clock frequency over the link.

Increasing data rates for serial interface standards have resulted in corresponding increases in the clock frequencies of CDR systems. For example, a CDR mechanism for a Serial Advanced Technology Attachment (SATA) receiver may execute at roughly half the clock frequency of the data signal over the SATA link to facilitate low-latency tracking of the data signal's clock frequency. As a result, CDR mechanisms in such high-speed serial interfaces tend to consume more power than CDR mechanisms which have higher latencies and/or which operate at slower data speeds.

SUMMARY

Some embodiments provide a clock and data recovery (CDR) system. The CDR system may be used to track an analog signal over a high-speed serial interface. In particular, the CDR system may include functionality to recover an embedded clock signal from the analog signal and use the recovered clock signal to sample the analog signal. Specifically, an input data stream generated from sampling of the analog signal can be used to lock onto to the embedded clock signal and to optimize the recovered clock signal, e.g., by maximizing the eye height and/or width.

The CDR system may include an integral path and a proportional path that are part of an integral-proportional control loop. The integral path may be used to track frequency modulation of the embedded clock signal, while the proportional path may be used to track phase modulation of the embedded clock signal. The proportional path may be executed at a first clock frequency, while the integral path may be executed at a second clock frequency that is lower than the first clock frequency to reduce the power consumption of the CDR system. Note that embodiments of the present invention have substantially the same latency as, but consume less power than, a CDR system which executes both the proportional and integral paths at the first clock frequency.

The CDR system can include a first deserializer that deserializes the input data stream to obtain a first deserialized data stream for use by the proportional path. The CDR system may also include a second deserializer that deserializes the input data stream to obtain a second deserialized data stream for use by the integral path. Data words in the second deserialized data stream may be longer than data words in the first deserialized data stream to enable the integral path to execute at a lower clock frequency than the proportional path. For example, each word in the first deserialized data stream may contain twice as many bits as the input data stream and operate at half the clock frequency of the input data stream, and each word the second deserialized data stream may contain eight times as many bits as the input data stream an operate at one-eighth the clock frequency of the input data stream.

The CDR system can also include a sampler that samples the output of the integral path (which tracks changes in the frequency of the embedded clock signal) at the first clock frequency, and an adder that adds the sampled output of the integral path to the output of the proportional path (which tracks changes in the phase of the embedded clock signal) to obtain an adder output. The output of the integral path can represent a frequency modulation that is desired to be applied to the recovered clock signal. In other words, the output of the integral path can represent an amount of phase change that needs to be added to the recovered clock signal to track the frequency of the embedded clock signal. The output of the proportional path can represent a phase modulation that is desired to be applied to the recovered clock signal. In other words, the output of the proportional path can represent an amount of phase change that needs to be added to the recovered clock signal to track the phase of the embedded clock signal.

An integrator in the CDR system may then update a control signal by adding the adder output to a current value of the control signal, and a phase mixer in the CDR system may use the control signal to adjust the recovered clock signal. In some embodiments, the control signal encodes a digital control word, and the phase mixer is a digital phase mixer that uses the digital control word to adjust the recovered clock signal.

Finally, the CDR system may include a data slicer that uses the recovered clock signal to generate the input data stream by sampling the analog signal at the frequency of the clock signal. The control signal can represent the phase and/or frequency difference between the recovered clock signal and the embedded clock signal in the analog signal. Since the proportional path is executed at a high frequency, the CDR system can accurately track the embedded clock signal in the analog signal, even when the analog signal is generated using a spread-spectrum clock.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing code and/or data now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, methods and processes described herein can be included in hardware modules or apparatus. These modules or apparatus may include, but are not limited to, an application-specific integrated circuit (ASIC) chip, a field-programmable gate array (FPGA), a dedicated or shared processor that executes a particular software module or a piece of code at a particular time, and/or other programmable-logic devices now known or later developed. When the hardware modules or apparatus are activated, they perform the methods and processes included within them.

Embodiments provide a method and system for performing clock and data recovery (CDR). The CDR may be performed by one or more hardware and/or software components associated with a high-speed serial interface. The high-speed serial interface may additionally adhere to a standard that specifies the bandwidth, tracking, clock speed, encoding, data transmission mechanisms, and/or any other parameters to be used by the high-speed serial interface. For example, the high-speed serial interface may correspond to a Serial Advanced Technology Attachment (SATA), Universal Serial Bus (USB), and/or Peripheral Component Interconnect (PCI) Express interface.

Figure 1:
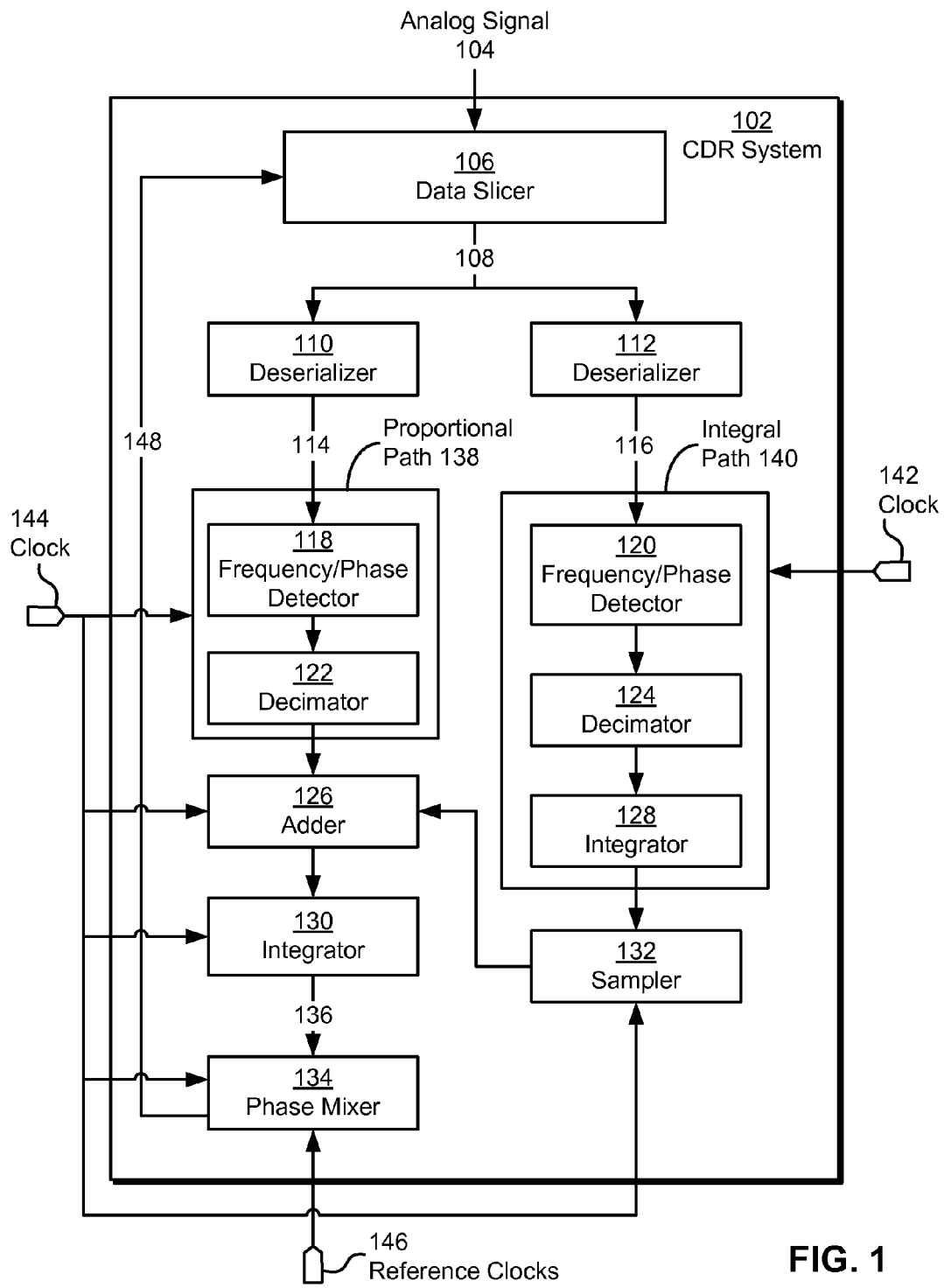
FIG. 1 shows a clock and data recovery (CDR) system in accordance with an embodiment.

As shown in FIG. 1, a CDR system 102 is used to perform clock and data recovery on an analog signal 104 in accordance with an embodiment. For example, CDR system 102 may be part of a receiver that receives analog signal 104 from a hard disk drive over a SATA bus.

In one or more embodiments, analog signal 104 is sampled by a data slicer 106 in CDR system 102 to produce a digital data input stream 108. For example, data slicer 106 may include a set of comparators that sample analog signal 104 twice per data period of analog signal 104 to generate a series of bits corresponding to input data stream 108. Further, clocking information may be embedded in analog signal 104. For example, 8b/10b encoding may be used to embed clocking information in analog signal 104.

The embedded clocking information may then be extracted by CDR system 102 and used to sample analog signal 104. In other words, CDR system 102 may include functionality to detect transitions in analog signal 104 and lock to the data rate of analog signal 104. CDR system 102 may further be configured to detect and respond to phase and/or frequency shift in the embedded clock in analog signal 104. Phase and/or frequency shifts in the embedded clock can occur due to the use of a spread-spectrum clock (SSC) to generate analog signal 104.

The clock frequency of CDR system 102 can affect both the latency and the power consumption of CDR system 102. Note that the clock frequency at which CDR system 112 operates may not be the same as the frequency of the recovered clock signal. Typically, the clock frequency at which CDR system 102 operates is less than the frequency of the recovered clock signal. However, the frequency of the recovered clock signal and the clock frequency of CDR system 112 are usually related (increasing the communication data rate usually requires increasing the operating clock frequency for the CDR system).

The execution of CDR system 102 at a higher clock frequency can reduce the latency of CDR system 102 and, in turn, increase the tracking bandwidth and pull-in bandwidth of CDR system 102. However, the execution of CDR system 102 at a higher clock frequency can increase the power consumption of CDR system 102. Conversely, decreasing the clock frequency of the CDR system can decrease power consumption, but increase the latency.

As shown in FIG. 1, CDR system 102 includes a proportional path 138 and an integral path 140. In one or more embodiments, integral path 140 (e.g., frequency/phase detector 120, decimator 124, integrator 128) is used to track frequency changes in analog signal 104, and proportional path 138 (e.g., frequency/phase detector 118 and decimator 122) is used to track phase changes in analog signal 104. Proportional path 138 may be designed to detect abrupt and/or short-term changes in the embedded clock signal, while integral path 140 may be designed to detect longer-term changes in the embedded clock signal.

In one or more embodiments, two separate clocks 142-144 are used to execute CDR system 102; clock 142 may synchronize the operation of integral path 140, while clock 144 may synchronize the operation of proportional path 138. In particular, proportional path 138 may be executed at a first clock frequency (e.g., using clock 144), while integral path 140 may be executed at a second clock frequency (e.g., using clock 142) that is lower than the first clock frequency. Because integral path 140 is used to detect relatively slow timing changes in analog signal 104, the slower execution of integral path 140 may reduce the power consumption of CDR system 102 without substantially impacting the latency of CDR system 102. The common path (i.e., adder 126, integrator 130, and phase mixer 134) that is shared by both the integral path and the proportional path is operated at the higher frequency clock, i.e., clock 144. Sampler 132 is also operated at the higher frequency clock, i.e., clock 144.

To facilitate execution of proportional path 138 and integral path 140 at different clock frequencies, input data stream 108 is sent to two deserializers 110-112 in CDR system 102. Deserializer 110 may deserialize input data stream 108 to obtain a first deserialized data stream 114 for use by proportional path 138, and deserializer 112 may deserialize input data stream 108 to obtain a second deserialized data stream 116 for use by integral path 140. In addition, data words in deserialized data stream 116 may be longer than data words in deserialized data stream 114 to enable integral path 140 to execute at a lower clock frequency than proportional path 138.

For example, input data stream 108 may include a series of bits from data slicer 106 at the clock frequency of data slicer 106. Deserializer 110 may allow clock 144 to execute proportional path 138 at half the clock frequency of data slicer 106 by transmitting deserialized data stream 114 as two parallel bits to proportional path 138. On the other hand, deserializer 112 may allow clock 142 to execute integral path 140 at one-eighth the clock frequency of data slicer 106 by transmitting deserialized data stream 116 as eight parallel bits to integral path 140.

Deserialized data streams 114 and 116 may then be processed by proportional path 138 and integral path 140 using clocks 144 and 142, respectively. Proportional path 138 and integral path 140 each include frequency/phase detectors 118 and 120 and decimators 122 and 124, respectively. Further, integral path can include integrator 128. Frequency/phase detectors 118 and 120 may detect changes in phase and/or frequency of analog signal 104. Decimators 122-124 may then perform decimation (e.g., low-pass filtering or voting or it may simply pass the decisions straight through) on the outputs of detectors 118-120 to enable proportional path 138 to track phase changes and enable integral path 140 to track frequency changes. Integrator 128 can perform an integration operation on the output of decimator 124 (e.g., by adding the output from decimator 124 with a stored value).

Next, sampler 132 and adder 126 may combine the value stored in integrator 128 with the output of decimator 122. Sampler 132 may sample the accumulated frequency modulation from integral path 140 (e.g., the value stored in integrator 128) at the first clock frequency (e.g., of clock 144), and adder 126 may add the frequency modulation to the phase modulation from decimator 122. As a result, the output of adder 126 may correspond to the output from integral path 140 combined with the output from proportional path 138. Integrator 130 may then perform a time integration of by adding the adder output from adder 126 to the current value of a control signal 136 stored in integrator 130.

Finally, control signal 136 may be used by a phase mixer 134 to adjust a clock signal 148 used by data slicer 106 to generate input data stream 108. In one or more embodiments, phase mixer 134 corresponds to a digital phase mixer that obtains control signal 136 as a digital control word and generates clock signal 148 using the digital control word and one or more reference clocks 146. For example, phase mixer 134 may use the digital control word to select a reference clock from reference clocks 146, and output the signal of the selected reference clock. Clock signal 148 may then be used by data slicer 106 to sample analog signal 104 and generate input data stream 108. In this manner, proportional path 138 and integral path 140 can form a negative-feedback proportional-integral control loop that maintains synchronization with analog signal 104 by detecting and responding to frequency and/or phase changes in analog signal 104.

Figure 2:
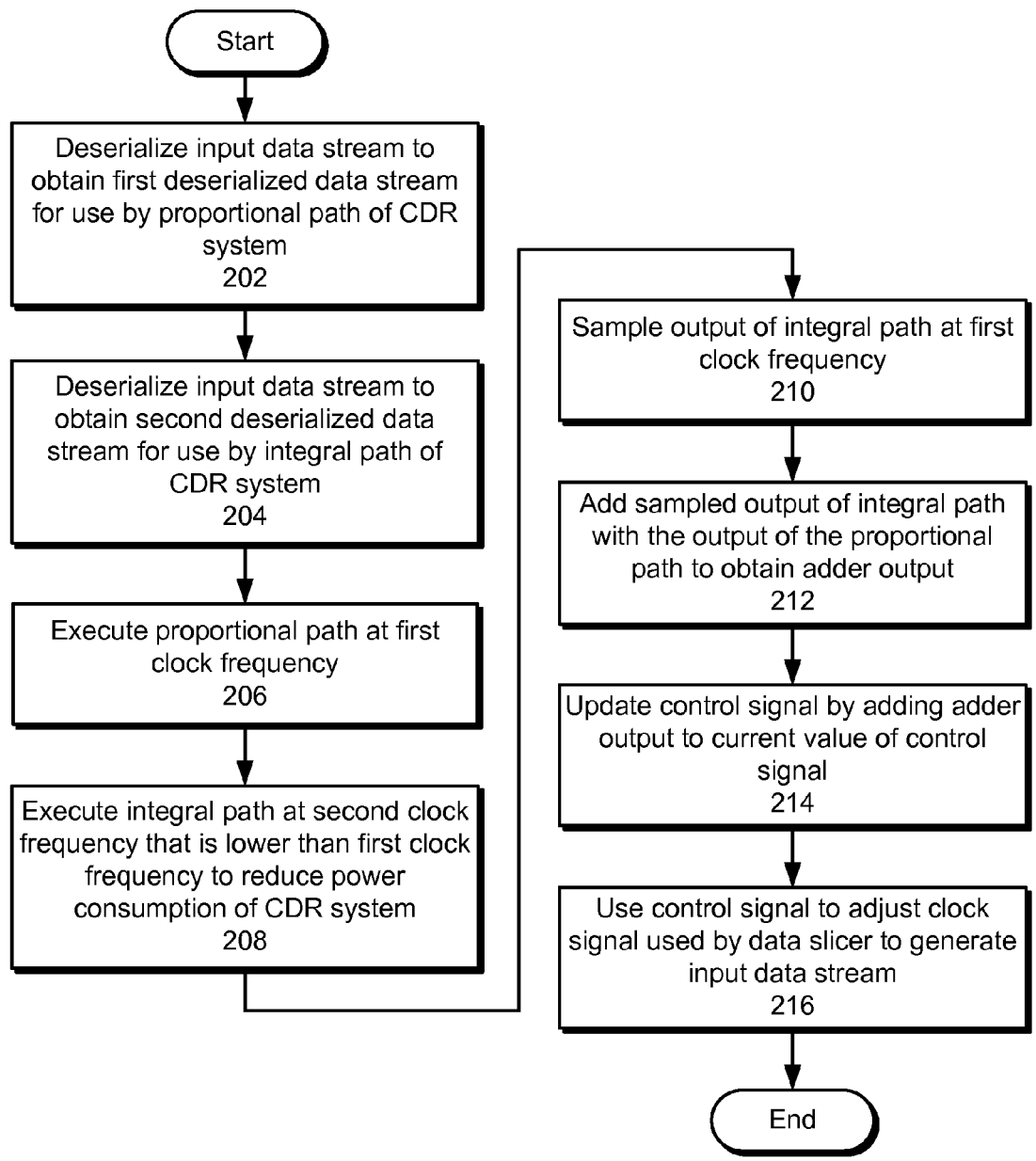
FIG. 2 shows a flowchart illustrating the process of performing CDR on an input data stream in accordance with an embodiment.

FIG. 2 shows a flowchart illustrating the process of performing CDR on an input data stream in accordance with an embodiment. In one or more embodiments, one or more of the steps may be omitted, repeated, and/or performed in parallel or in a different order. Accordingly, the specific arrangement of steps shown in FIG. 2 should not be construed as limiting the scope of the embodiments.

First, the input data stream is deserialized to obtain a first deserialized data stream for use by a proportional path (operation 202) of a CDR system (e.g., CDR system 102 of FIG. 1) and a second deserialized data stream for use by an integral path (operation 204) of the CDR system. The input data stream may be generated by sampling an analog signal which contains an embedded clock signal (e.g., an analog signal sent over a high-speed serial interface). The proportional path may be used to detect short-term phase changes in the analog signal, while the integral path may be used to detect longer-term frequency changes in the analog signal.

The power consumption of the CDR system may be reduced while maintaining the low latency of the proportional path by executing the proportional path at a first clock frequency (operation 206) and executing the integral path at a second clock frequency that is lower than the first clock frequency (operation 208).

Next, an output from the integral path is sampled at the first clock frequency (operation 210) and the sampled output is added to an output from the proportional path to obtain an adder output (operation 212). The adder output may then be added to a current value of a control signal to update the control signal (operation 214).

The control signal may then be used to adjust a clock signal used by a data slicer to generate the input data stream (operation 216). Specifically, the data slicer may generate the input data stream by sampling the analog signal at the rising and/or falling edges of the clock signal.

Figure 3:
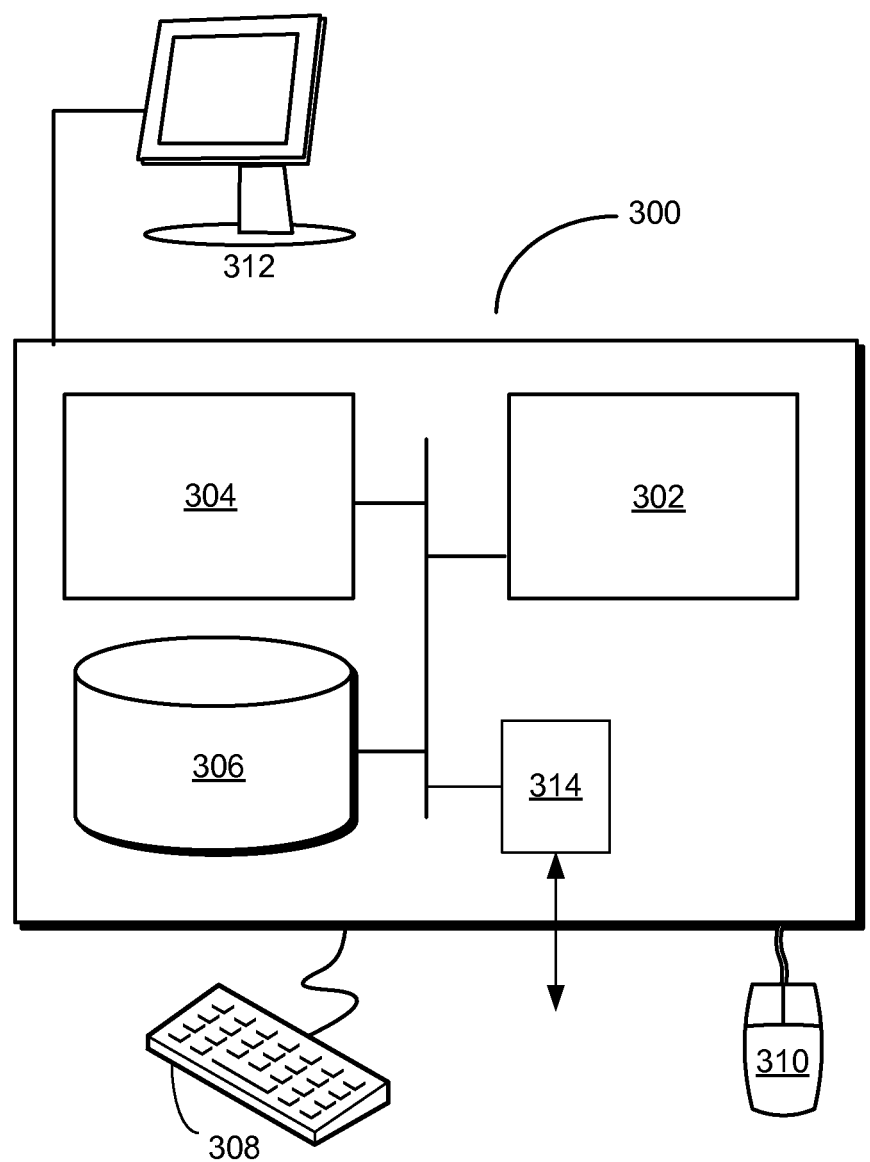
FIG. 3 shows a computer system in accordance with an embodiment.

FIG. 3 shows a computer system 300 in accordance with an embodiment. A computer or computer system can generally be any system that can perform computations. Specifically, a computer can be a microprocessor-based system which may include multiple processing cores, a network-processor-based system, a digital-signal-processor-based system, a portable computing device (e.g., a smart phone), a personal organizer, a distributed-computing-platform-based system, or any other computing system now known or later developed. Computer system 300 may correspond to an apparatus that includes a processor 302, memory 304, storage 306, and/or other components found in electronic computing devices. Processor 302 may support parallel processing and/or multi-threaded operation with other processors in computer system 300. Computer system 300 may also include input/output (I/O) devices such as a keyboard 308, a mouse 310, and a display 312.

Computer system 300 may include an operating system (not shown) that coordinates the use of hardware and software resources on computer system 300, as well as one or more applications that perform specialized tasks for the user. To perform tasks for the user, applications may obtain the use of hardware resources on computer system 300 from the operating system, as well as interact with the user through a hardware and/or software framework provided by the operating system.

In one or more embodiments, computer system 300 may include a communication interface 314 (e.g., a high-speed serial interface) that includes CDR circuitry (e.g., the circuitry shown in FIG. 1). Communication interface 314 can enable computer system 300 to communicate with other systems via wired or wireless channels. The CDR circuitry may include a proportional path executed at a first clock frequency, and an integral path executed at a second clock frequency that is lower than the first clock frequency to reduce the power consumption of the CDR circuitry without sacrificing latency.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A method for performing clock and data recovery (CDR) on an input data stream, comprising:
   executing a proportional path of a CDR system at a first clock frequency;
   executing an integral path of the CDR system at a second clock frequency that is lower than the first clock frequency to reduce power consumption of the CDR system without sacrificing latency;
   executing a sampler at the first clock frequency, wherein the sampler samples an output of the integral path, and wherein the integral path executes at the second clock frequency while the sampler is executing at the first clock frequency;
   adding the sampled output of the integral path to an output of the proportional path to obtain an adder output;

updating a control signal by adding the adder output to a current value of a control signal; and using the control signal to adjust a clock signal used by a data slicer to generate the input data stream.

2. The method of claim 1, further comprising:

deserializing the input data stream to obtain a first deserialized data stream for use by the proportional path; and deserializing the input data stream to obtain a second deserialized data stream for use by the integral path, wherein data words in the second deserialized data stream are longer than data words in the first deserialized data stream.

3. The method of claim 1, wherein the control signal corresponds to a digital control word.

4. The method of claim 3, wherein the clock signal is generated by a phase mixer using the digital control word.

5. The method of claim 1, wherein the input data stream is sampled from an analog signal which is generated using a spread-spectrum clock.

6. The method of claim 1, wherein the proportional path and the integral path are part of a proportional-integral control loop.

7. A clock and data recovery (CDR) system, comprising:

a proportional path executed at a first clock frequency;

an integral path executed at a second clock frequency that is lower than the first clock frequency to reduce power consumption of the CDR system without sacrificing latency;

a sampler executed at the first clock frequency, wherein the sampler samples an output of the integral path, and wherein the integral path executes at the second clock frequency while the sampler is executing at the first clock frequency;

an adder configured to add the sampled output of the integral path to an output of the proportional path to obtain an adder output;

an integrator configured to update a control signal by adding the adder output to a current value of the control signal; and a phase mixer configured to use the control signal to adjust a clock signal, wherein the clock signal is used by a data slicer to generate the input data stream.

8. The CDR system of claim 7, further comprising:

a first deserializer configured to deserialize the input data stream to obtain a first deserialized data stream for use by the proportional path; and a second deserializer configured to deserialize the input data stream to obtain a second deserialized data stream for use by the integral path, wherein data words in the second deserialized data stream are longer than data words in the first deserialized data stream.

9. The CDR system of claim 7, wherein the control signal corresponds to a digital control word.

10. The CDR system of claim 7, wherein the input data stream is sampled from an analog signal that is generated using a spread-spectrum clock.

11. The CDR system of claim 10, wherein the proportional path and the integral path are part of a proportional-integral control loop.

12. An apparatus, comprising:

a processor;

a memory; and a serial interface comprising clock and data recovery (CDR) circuitry, wherein the CDR circuitry comprises:

a proportional path executed at a first clock frequency;

an integral path executed at a second clock frequency that is lower than the first clock frequency to reduce power consumption of the CDR circuitry without sacrificing latency;

a data slicer configured to generate an input data stream by using a clock signal to sample an analog signal;

a sampler executed at the first clock frequency, wherein the sampler samples an output of the integral path, and wherein the integral path executes at the second clock frequency while the sampler is executing at the first clock frequency;

an adder configured to add the sampled output of the integral path to an output of the proportional path to obtain an adder output;

an integrator configured to update a control signal by adding the adder output to a current value of the control signal; and a phase mixer configured to use the control signal to adjust the clock signal.

13. The apparatus of claim 12, wherein the CDR circuitry comprises:

a first deserializer configured to deserialize the input data stream to obtain a first deserialized data stream for use by the proportional path; and a second deserializer configured to deserialize the input data stream to obtain a second deserialized data stream for use by the integral path, wherein data words in the second deserialized data stream are longer than data words in the first deserialized data stream.

* * * * *